United States Patent

Nishiura et al.

[11] Patent Number: 5,869,890
[45] Date of Patent: Feb. 9, 1999

[54] INSULATION SUBSTRATE FOR A SEMICONDUCTOR DEVICE

[75] Inventors: Masaharu Nishiura, Kanagawa; Akira Morozumi, Nagano; Tomio Shimizu, Nagano; Katsumi Yamada, Nagano; Shigemasa Saito, Nagano, all of Japan

[73] Assignee: Fuji Electric Co., Ltd., Japan

[21] Appl. No.: 938,484

[22] Filed: Sep. 30, 1997

Related U.S. Application Data

[63] Continuation of Ser. No. 588,253, Jan. 18, 1996, abandoned.

[30] Foreign Application Priority Data

Jan. 19, 1995 [JP] Japan ..................................... 7-006104

[51] Int. Cl.⁶ .............................. H01L 23/06; H01L 23/10
[52] U.S. Cl. .......................... 257/705; 257/706; 257/707; 257/713; 257/796; 361/690; 361/707; 361/708
[58] Field of Search ..................................... 257/705, 706, 257/707, 712, 713, 720, 796, 700; 361/707, 708, 690, 712, 809, 714

[56] References Cited

U.S. PATENT DOCUMENTS 5,561,321 10/1996 Hirano et al. ........................... 257/700

*Primary Examiner*—Carl W. Whitehead, Jr.
*Attorney, Agent, or Firm*—Morrison Law Firm

[57] ABSTRACT

A Ceramic Bonding Copper (CBC) substrate used in semiconductor modules includes a ceramic plate having foil-shaped copper plates bonded to the ceramic plate by the direct copper bonding method. A circuit pattern is formed on one of the copper plates. The ceramic plate is fabricated by sintering at high temperature an alumina powder compact containing zirconia and one or more of the following additives: yttria, calcia, magnesia, and ceria. The flexural strength and the thermal conductivity of the alumnina ceramic plate of the invention are remarkably improved, facilitating a reduction in the thickness of the ceramic plate. The reduction in thickness of the CBC substrate further improves the ability of the semiconductor device to radiate heat and therefore increases the current carrying capability of the semiconductor device.

13 Claims, 10 Drawing Sheets

INSULATION SUBSTRATE FOR A SEMICONDUCTOR DEVICE

This application is a continuation, of application Ser. No. 08/588,253, filed Jan. 18, 1996, now abandoned.

BACKGROUND OF THE INVENTION

The present invention relates to an insulation substrate, on which semiconductor chips are soldered. The insulation substrate includes a ceramic core plate (insulation core plate) having foil-shaped copper plates bonded directly to it. The insulation substrate is used in "power modules" or power semiconductor devices such as converters, inverters, switching power supplies, constant voltage constant frequency (CVCF) power supplies, variable voltage variable frequency power supplies, other power supply circuits and control circuits for the various power supplies.

Referring to FIG. 1, a prior art power module has a Ceramic Bonding Copper (CBC) substrate 2 soldered to a metal radiator base 1. CBC substrate 2 includes a ceramic plate 2a sandwiched between a thin foil-shaped upper copper plate 2c and a thin foil-shaped lower copper plate 2b. Each of upper copper plate 2c and lower copper plate 2c is directly bonded to ceramic plate 2a by a direct bonding copper method (the method of bonding copper by using a Cu—O eutectic liquid phase yielded by a reaction of copper and a trace amount of oxygen). Ceramic plate 2a is made, for example, of alumina ($Al_2O_3$) or aluminum nitride (AlN). A circuit pattern (thick film circuit pattern) is formed on an upper surface of upper copper plate 2c. A semiconductor chip 3 is mounted on CBC substrate 2.

Curved tips of lead terminals 4 are soldered to the circuit pattern formed on upper copper plate 2c. A terminal block 7 fixes the positions of lead terminals 4. Semiconductor chip 3 is electrically connected to lead terminals 4 by bonding wires 5. A gel resin 9 fills an inner space formed by metal radiator base 1 on the bottom and a resin case 6 on the sides. A sealant resin 8 on top of gel resin 9 closes resin case 6.

In the above described prior art embodiment, problems regarding the radiation of generated heat ensue when CBC substrate 2 is used as a thick film circuit board on which semiconductor chip 3 of a power module is mounted.

Since currents in power modules are larger than other semiconductor circuits, a semiconductor chip 3 in a power module generates a considerable amount of heat when a large amount of current flows through it. The generated heat is conducted by metal radiator base 1 via CBC substrate 2 and radiated from metal radiator base 1. Therefore, the thermal conductivity of CBC substrate 2 is an important factor in determining the current capacity of the semiconductor device.

However, because CBC substrate 2 has a laminate structure (ie. thin foil-shaped upper and lower copper plates 2c and 2b on respective sides of ceramic core plate 2a), its thermal conductivity is relatively low. The specific thermal conductivity values of alumina and aluminum nitride, used as the material of ceramic plate 2a, are listed below.

Alumina: 21 W/m·k

Aluminum nitride: 180 W/m·k

Although aluminum nitride exhibits a thermal conductivity that is far superior to that of alumina, aluminum nitride is much more expensive than alumina and is therefore undesirable for that reason.

To improve the heat radiation of the prior art semiconductor devices, metal radiator plate 1 is sometimes fixed to a heat sink with a bolt or bolts. However, force exerted by the bolts and warping caused by heat exert a bending stress on metal radiator plate 1. The resulting bending stress can deflect metal radiator plate 1 and CBC substrate 2 which is soldered to the metal radiator plate 1. Because the flexural strength and deflection tolerance of ceramics are relatively low compared to metal radiator 1, cracks or cleavages develop in the CBC substrate, thereby reducing its insulative properties.

The flexural strength is approximately 300 MPa for aluminum nitride and 400 MPa for alumina, and the deflection tolerance is approximately 0.2 mm for aluminum nitride and 0.3 mm for alumina. Therefore, aluminum nitride, which has greater thermal conductivity, is weaker than alumina mechanically. Various counter measures should be taken to prevent the development of cracks in the CBC substrate, even though the deviations of the deflection in the heat sink have been estimated to be approximately 100 μm.

It is possible to design CBC substrate 2 with a deflection tolerance of a fraction of the deflection caused in the semiconductor device, to prevent the development of cracks in CBC substrate 2, by dividing CBC substrate 2 into a plurality of substrates. However, the spaces between the independent CBC substrates fixed on metal radiator base 1 conflict with the design goals of the device integration and size reduction. Dividing CBC substrate 2 enlarges the semiconductor device and increases the number of parts and components as well adding cumbersome internal wiring work between the individual CBC substrates. Therefore, using a plurality of thin CBC substrate layers instead of a single larger one is not an effective solution.

Referring to FIG. 2, another counter measure for preventing the development of cracks in CBC substrate 2 includes an elastic bending part 4b formed on the side of a tip part 4a in an inner lead section of lead terminal 4. In addition, the peripheral part of upper copper plate 2c, on which a circuit pattern is formed, is raised above the upper surface of ceramic plate 2a. Since the stress caused in the ceramic plate 2a may be relaxed by the inclusion of the elastic bending part 4b and the floated peripheral part of the copper plate 2c, the development of cracks in the CBC substrate is prevented.

However, this counter measure requires a pressing process for each lead terminal 4 to form the elastic bending part 4b in the inner lead section. This counter measure is not easily applied to the batch assembly of the power modules. In the batch process, lead frames for the power modules are made of many lead terminals 4 connected with one another by a tie bar. The lead terminals are fixed to terminal block 7, the tip parts 4a are soldered, and finally, the tie bar is cut. The pressing process is difficult to incorporate into this batch assembly procedure. In addition to the increased complexity of the batch assembly of lead frames, the manufacturing cost of CBC substrate 2 is also increased since etching and cleaning processes are necessary to float the peripheral part of upper copper plate 2c.

OBJECTS AND SUMMARY OF THE INVENTION

It is an object of the present invention to provide a semiconductor device with a ceramic core plate having improved flexural strength without any special structure for stress relaxation.

It is another object of the invention to provide a semiconductor device that facilitates using a ceramic core plate containing alumina as the main constituent, improving its mechanical strength, especially the flexural strength (toughness against deflection) by mixing additives into the alumina.

It is another object of the present invention to provide a semiconductor device with improved heat radiation by reducing the thickness of the ceramic core plate.

Briefly stated, a Ceramic Bonding Copper (CBC) substrate used in semiconductor modules includes a ceramic plate having foil-shaped copper plates bonded to the ceramic plate by the direct copper bonding method. A circuit pattern is formed on one of the copper plates. The ceramic plate is fabricated by sintering at high temperature an alumina powder compact containing zirconia and one or more of the following additives: yttria, calcia, magnesia, and ceria. The flexural strength and the thermal conductivity of the alumina ceramic plate of the invention are remarkably improved, facilitating a reduction in the thickness of the ceramic plate. The reduction in thickness of the CBC substrate further improves the ability of the semiconductor device to radiate heat and therefore increases the current carrying capability of the semiconductor device.

The present inventors have tried to reduce the thermal resistance of a CBC substrate by reducing the thickness of a ceramic plate, of the CBC substrate, made of cheap alumina. However, when the thickness of the ceramic plate substrate made of alumina is reduced to a thickness of, for example, 0.3 mm, the mechanical strength (particularly the resistance against impact) of the ceramic plate lowers. As the mechanical strength of the ceramic plate lowers, defects develop more readily during the bonding of semiconductor chip 3 and upper copper plate 2c, of the CBC substrate, to one another. The defects are caused by the thermal stress which develops because of differences in the thermal expansion coefficients of the constituent materials of CBC substrate 2. The specific thermal expansion coefficients of each material are listed below.

Silicon (semiconductor chip): $4.0 \times 10^6/°C$.

Alumina: $7.5 \times 10^6/°C$.

Copper: $18.0 \times 10^6/°C$.

According to the present invention, there is described, a ceramic insulator comprising a ceramic plate, said ceramic plate having alumina as a main constituent, and said ceramic plate also including at least one oxide added to said alumina.

According to another embodiment of the present invention, there is described, a semiconductor device comprising a base plate, a lead frame having at least one lead terminal, a substrate having a ceramic plate and two thin-foil shaped copper plates bonded to said ceramic plate, said ceramic plate having alumina as a main constituent, said ceramic plate also including at least one oxide added to said alumina, a semiconductor chip, said substrate mounted on said base plate, said semiconductor chip mounted on said substrate, and means for electrically connecting said semiconductor chip to said at least one lead terminal.

According to yet another embodiment of the present invention, there is described, a semiconductor device comprising a lead frame having inner leads, a semiconductor chip electrically connected to tips of said inner leads, a metal radiator base, an insulation substrate fixed on an inner face of said metal radiator base, said semiconductor chip mounted on said insulation substrate such that said insulation substrate is between said metal base and said semiconductor chip, and said insulation substrate including a ceramic plate made from alumina as the main constituent and zirconia added to the alumina.

The ceramic insulation plate contains between 70 and 100 weight % of alumina, between 0 and 30 weight % of zirconia, and between 0.02 and 2 weight % of the at least one additive. The at least one additive can be yttria, calcia, magnesia, or ceria. The specific ranges of additive content are 0.1 to 2 wt. % for yttria, 0.02 to 0.5 wt. % for calcia, 0.02 to 0.4 wt. % for magnesia, and 0.02 to 0.5 wt. % for ceria. The ceramic insulation plate may also contain two of the additives listed above, the total content of the two additives is from 0.05 to 1.0 mol %.

Although the weight % of alumina can be more than 70 weight % to less than 100 weight % to realize the desired characteristics of the present invention, the optimum content of alumina and zirconia is from 82 to 97 weight %, and from 2.5 to 17.5 weight %, respectively. The grain diameter of the powder raw materials of the ceramic insulation plate is from 0.5 to 3 μm.

The foil-shaped copper plates are bonded to both major faces of the ceramic insulation plate.

The mechanical strength, especially the flexural strength, of the ceramic insulation plate of the present invention (containing alumina as the main component thereof, zirconia added to alumina, and at least one additive selected from a group consisting of yttria, calcia, magnesia, and ceria) is greatly improved as compared with the conventional undoped alumina ceramic plate. The thermal conductivity of the ceramic insulation plate is further improved without deteriorating the mechanical strength, especially the deflection tolerance, by setting the added content of zirconia at between 2.5 and 17.5 weight %. The increased thermal conductivity and increased strength facilitates the reduction of the thickness of the ceramic insulation plate, and a CBC substrate, that radiates heat quickly, is obtained for the semiconductor devices.

The additives, yttria, calcia, magnesia and ceria, lower the sintering temperature of the ceramic insulation plate, and improve the toughness of the zirconia grains. The same effects may be obtained adding the additives in one of two ways: simply adding zirconia, plus one of yttria, calcia, magnesia, and ceria or adding a form of zirconia stabilized or partially stabilized with these additives.

Since the ceramic insulation plate of the present invention maintains great mechanical strength, it can be made into pieces covering a wider area than conventional ceramic plates, facilitating higher device integration. It is necessary to form the bending part for stress relaxation on the inner lead, which facilitates reducing the thickness of the semiconductor device. Since the floated periphery is eliminated from the copper plate, the manufacturing steps and cost are also reduced.

DETAILED DESCRIPTION OF THE PREFERRED EMBODIMENTS

Figure 3A:
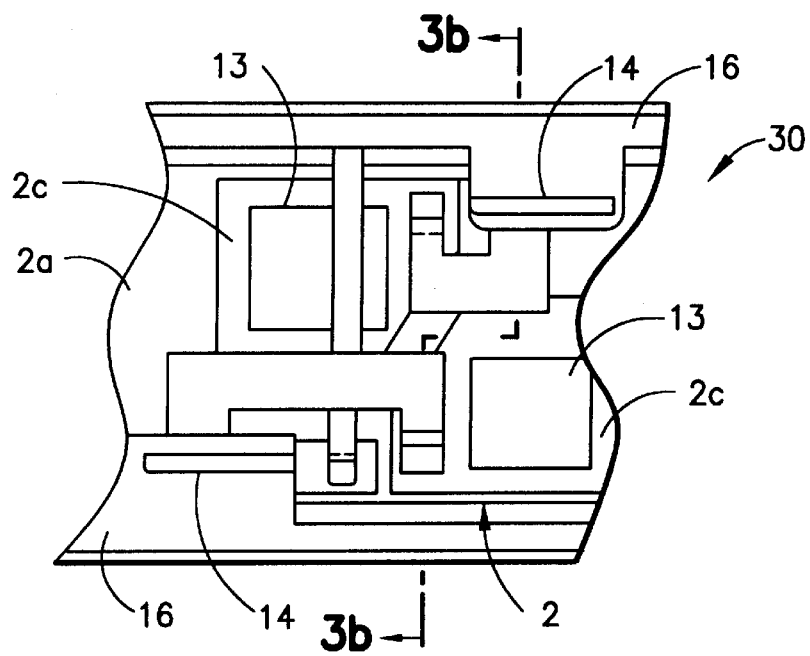
FIG. 3(a) is a top plan view of an embodiment of a power semiconductor device according to the present invention.
Figure 3B:
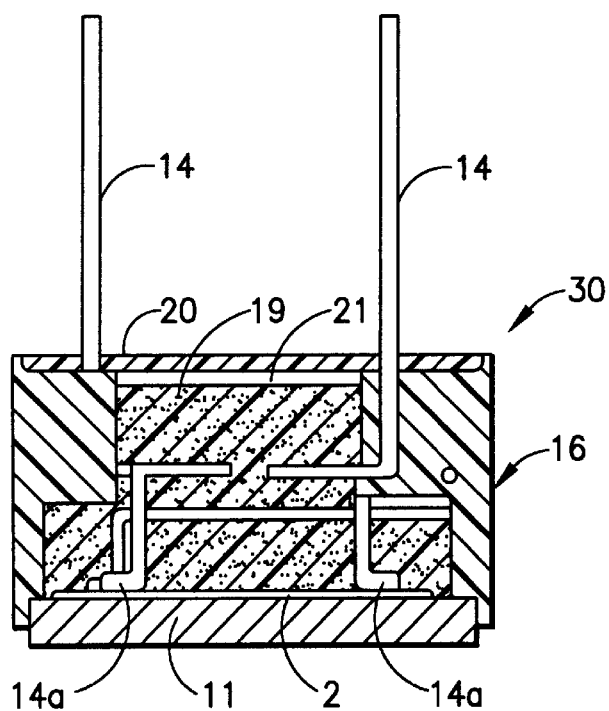
FIG. 3(b) is a cross section along A—A' of FIG. 3(a)

Referring to FIGS. 3(a) and 3(b) a power semiconductor device 30 (also called a "power module" or an "intelligent power module") has an insulation resin case frame 16 having a lead frame 14. A metal radiator base 11 is bonded to a first side of case frame 16 so as to close a first opening of case frame 16. A CBC substrate 2 is soldered to the inner surface of metal radiator base 11. Semiconductor chips 13 are mounted on CBC substrate 2. Inner lead tips 14a of lead frames 14 are soldered to a foil-shaped upper copper plate 2c of CBC substrate 2. Gel resin (silicone resin) sealant 19 fills case frame 16 so that CBC substrate 2 and lead frames 14 are immersed. A cover plate 20, made of insulation resin, is bonded with adhesive to a second side of case frame 16 to close a second opening of case frame 16. A space 21 is left between gel resin (silicone resin) sealant 19 and cover plate 20.

Figure 1:
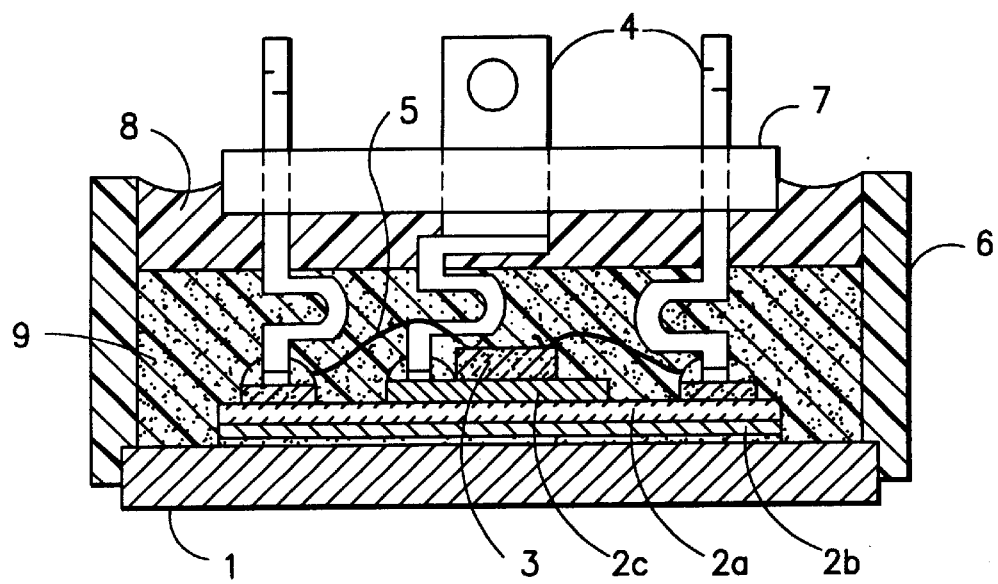
FIG. 1 is a cross section of a conventional power semiconductor module.
Figure 2:
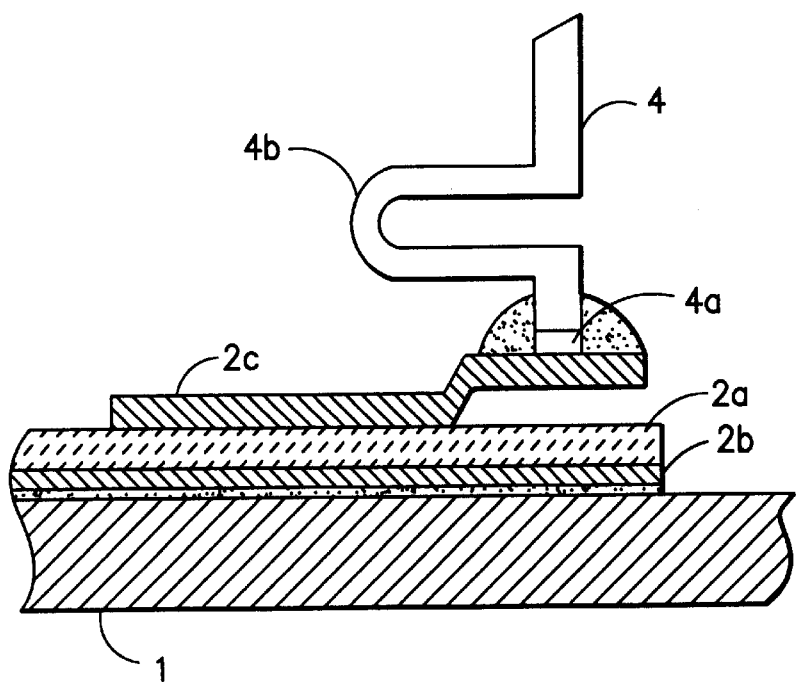
FIG. 2 is a cross section showing the connection of the CBC substrate and the lead-out terminal in the power semiconductor module of FIG. 1.

CBC substrate 2 consists of a ceramic plate (insulation core plate) 2a, thin foil-shaped upper copper plate 2c and a thin foil-shaped lower copper plate 2b (lower copper plate 2b is not shown in FIGS. 3(a) or 3(b)). Upper and lower copper plates 2c and 2b are directly bonded to ceramic plate 2a. The bonding is accomplished, for example, by the direct bonding copper method (the method of bonding copper by using a Cu—O eutectic liquid phase yielded by a reaction of copper and a trace amount of oxygen). A circuit pattern (thick film circuit pattern) is formed on the upper surface of upper copper plate 2c. In contrast to the prior art example of FIG. 2, the peripheral portion of the copper plate 2c is not floated in this embodiment. The elastic bending portion of lead frames 14 and the floated peripheral part of copper plate 2c are avoided in this embodiment by virtue of the improved fracture toughness of ceramic core plate 2a.

Ceramic core plate 2a is prepared as follows: Alumina ($Al_2O_3$), zirconia ($ZrO_2$) and yttria ($Y_2O_3$) are mixed and pulverized to a particle diameter of 0.5 to 3 $\mu$m. The pulverized oxide mixture is then mixed for 20 hrs with 8 wt. % of poly(vinyl butyral) as a binder, 50 wt. % of mixed solvent consisting of toluene and xylene, and 2 wt. % of dioctyl phthalate (DOP) as a plasticizer. The mixture is formed into a green sheet by the doctor blade method. The green sheet is die-cut in a predetermined shape in a press. Finally, the die-cut specimens are sintered at 1550° to 1650° C. to form sintered ceramic plates 0.2 to 0.7 mm in thickness.

Figure 4A:
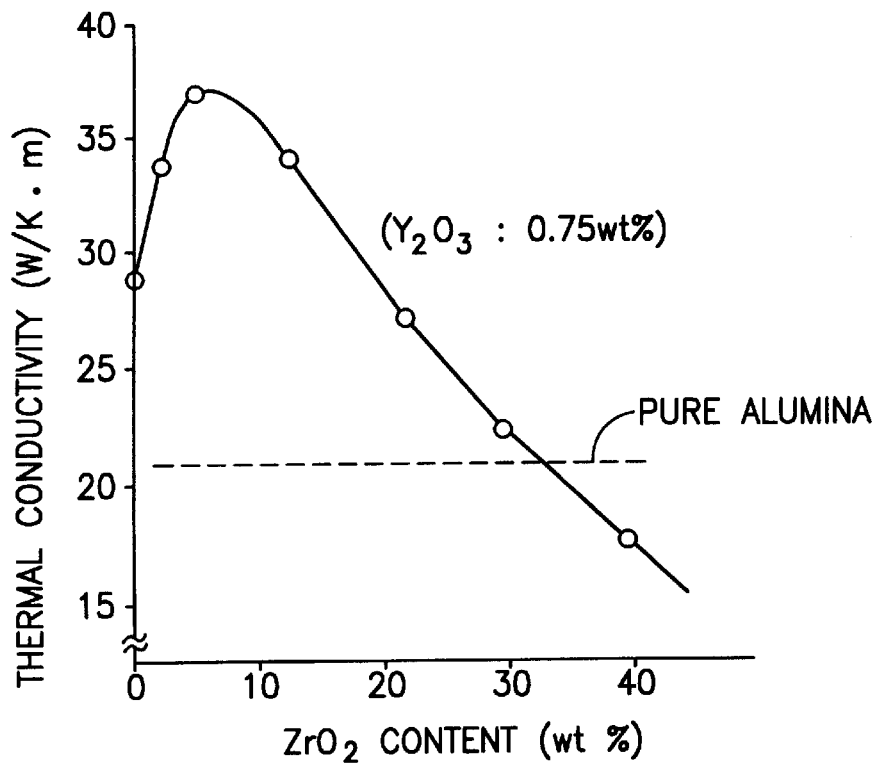
FIG. 4(a) is a graph relating the thermal conductivity and the amount of added zirconia of an alumina ceramic plate.

Test specimens 5 mm in width, 60 mm in length, and 0.5 mm in thickness were used to test the thermal conductivity and flexural strength of the ceramic plate relative to the amount of zirconia present. Yttria was added, to as much as 0.75 wt. %, as a partial stabilizer. Referring now also to FIG. 4(a), the thermal conductivity generally decreases as the amount of zirconia added to ceramic plate 2a is increased. Higher values of thermal conductivity, compared to undoped alumina (represented by a broken line), were exhibited between 0 and 30 wt. % of added zirconia. When the added amount of zirconia is between 2.5 to 17 wt. %, a thermal conductivity higher than the highest reported thermal conductivity for $\alpha$-alumina (30 W/km) is obtained. This very high thermal conductivity may be attributed to the addition of yttria.

Figure 4B:
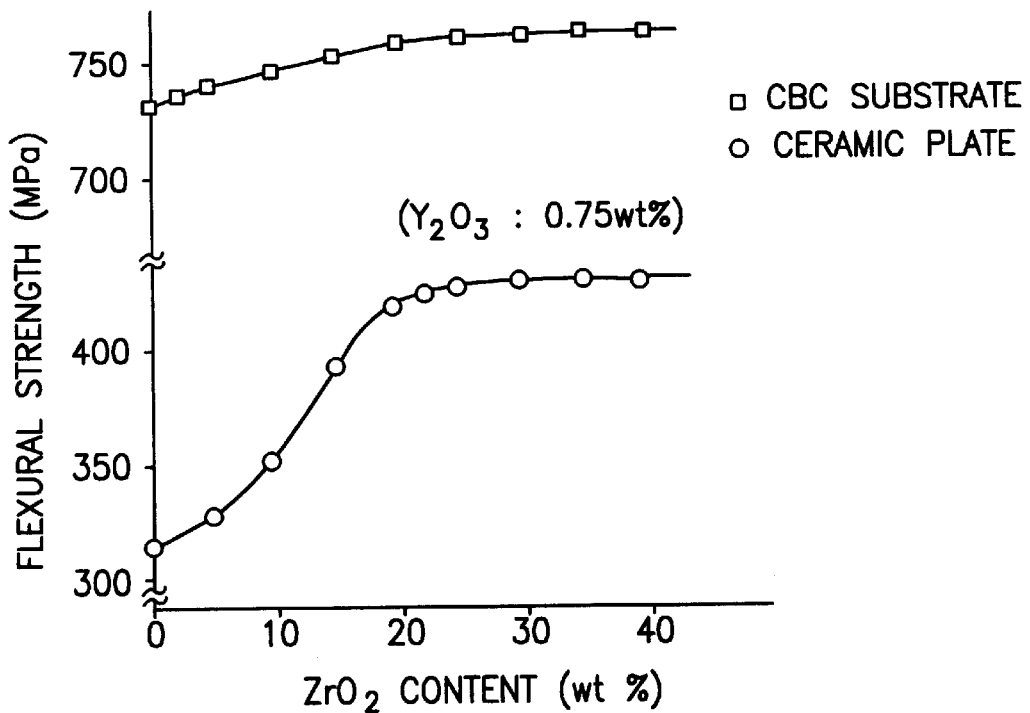
FIG. 4(b) is a graph relating the flexural strength and the amount of added zirconia of an alumina ceramic plate and that of the CBC substrate that has the alumina ceramic plate.

Referring now also to FIG. 4(b), the flexural strength of ceramic plate 2a increases as the amount of zirconia added to ceramic plate 2a increases, and saturates beyond 25 wt. % of added zirconia. CBC substrate 2 exhibits flexural strength about twice as high as that of ceramic plate 2a. The high strength can be attributed to the sandwich structure of CBC substrate 2 in that ceramic plate 2a is sandwiched between upper and lower copper plates 2c and 2b. The flexural strength of CBC substrate 2 does not lower as remarkably as ceramic plate 2a does with reduced amount of added zirconia. These effects, described above, may be attributed to the large amount (0.75 wt. %) of added yttria. Usually, less than 0.01 wt. % yttria is inevitable as an impurity in the usual sintering of ceramics.

Figure 5A:
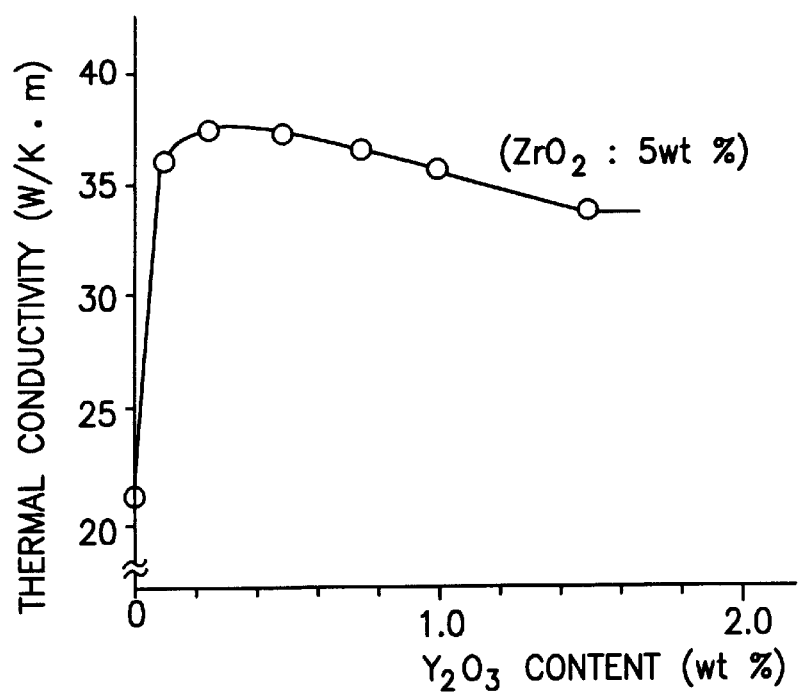
FIG. 5(a) is a graph relating the thermal conductivity and the amount of added yttria of an alumina ceramic plate having 5 wt. % zirconia.

Referring now to FIGS. 3(a), 3(b), and 5(a), with the zirconia content of ceramic plate 2a fixed at 5 wt. %, the thermal conductivity shows a maximum between an yttria dose of ceramic plate 2a between 0.2 wt. % and 0.6 wt. %. At the yttria dose of 0 wt. % (when yttria is not added intentionally), the thermal conductivity of ceramic plate 2a is near that of the usual alumina (about 22 W/km) as shown in FIG. 4(a).

Figure 5B:
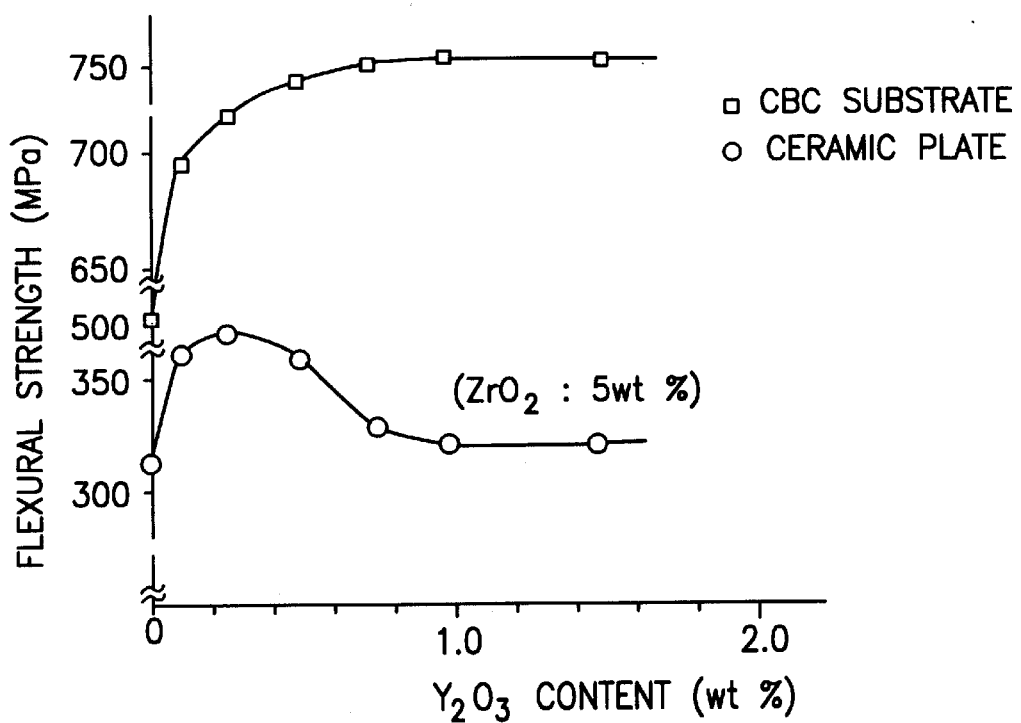
FIG. 5(b) is a graph relating the flexural strength and the amount of added yttria of an alumina ceramic plate having 5 wt. % zirconia and that of a CBC substrate having the alumina ceramic plate.

Referring now also to FIG. 5(b), with the zirconia contents of ceramic plate 2a and CBC substrate 2 fixed at 5 wt. %, the flexural strength of ceramic plate 2a shows a maximum at approximately 0.2 wt. % of yttria dose. The flexural strength of CBC substrate 2 lowers gradually with reduced amount of added yttrium, and lowers sharply towards the flexural strength at the yttrium addition of 0 wt. %. Thus, the addition of yttria contributes to the improvement of the properties of ceramic plate 2a. However, as the added yttria exceeds 2 wt. %, the flexural strength exhibits large deviations. Therefore, the optimum amount of yttria addition to ceramic plate 2a is from 0.1 to 2 wt. %.

Figure 6:
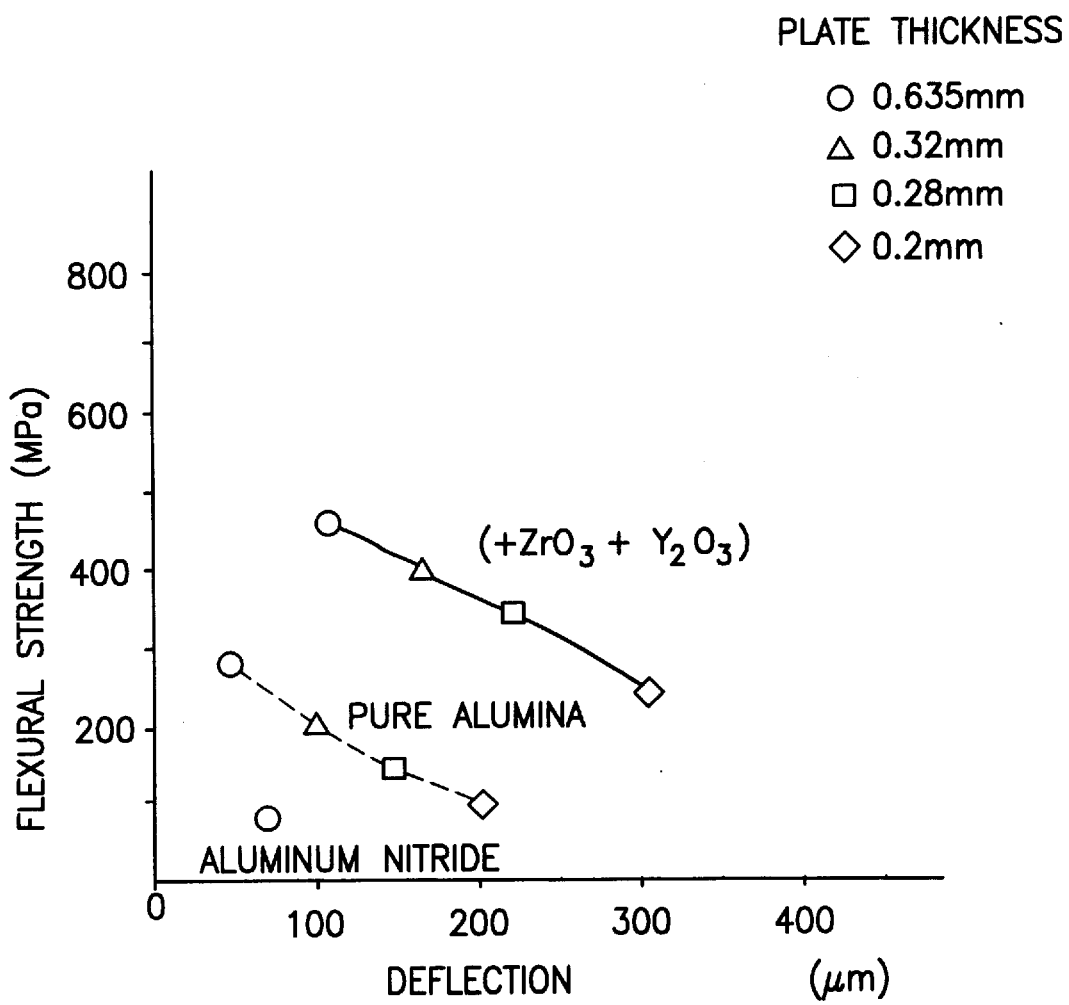
FIG. 6 is a graph showing the change in the relation between the flexural strength and the deflection with the plate thickness of an alumina ceramic plate containing 22.5 wt. % of zirconia and 0.75 wt. % of yttria.

The flexural strength and the deflection that causes cracking depend greatly on the thickness of ceramic plate 2a. Referring to FIG. 6 a graph of the relation between the flexural strength and the deflection with the thickness of ceramic plate 2a containing 22.5 wt. % of zirconia and 0.75 wt. % of yttria. The relationship between the flexural strength and the deflection of undoped alumina ceramic plate 2a and ceramic plate 2a made of aluminum nitride is also depicted. Ceramic plate 2a, made of alumina containing 22.5 wt. % of zirconia and 0.75 wt. % of yttria, exhibits higher flexural strength than the undoped alumina ceramic plate and the aluminum nitride ceramic plate. Ceramic plate 2a containing zirconia and yttria includes adequate toughness against deflection (fracture toughness), and excellent resistance against impact.

Figure 7:
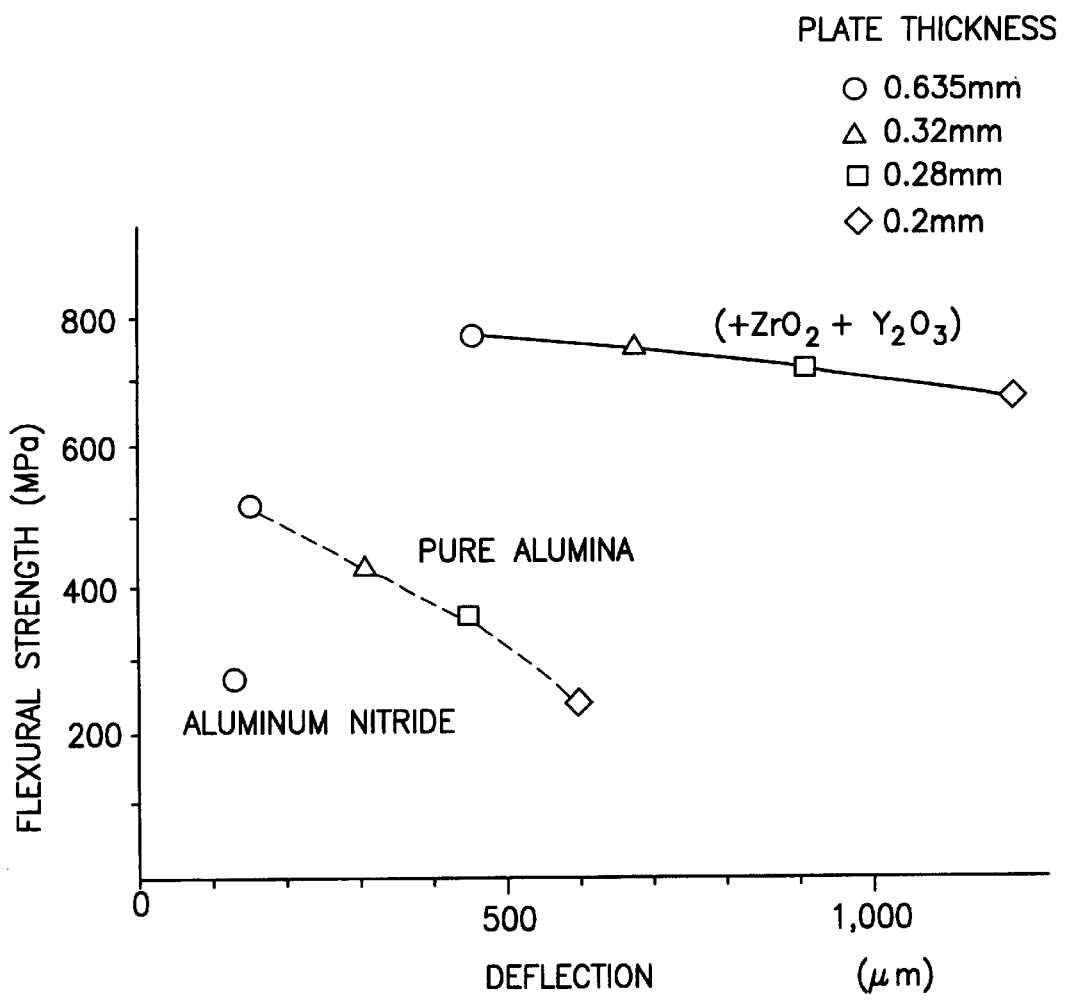
FIG. 7 is a graph showing the dependence of the flexural strength and the deflection on the plate thickness of a CBC substrate that employs an alumina ceramic plate containing 22.5 wt. % of zirconia and 0.75 wt. % of yttria.

FIG. 7 is a graph showing the dependence of the flexural strength and the deflection on the plate thickness of CBC substrate 2 which has ceramic plate 2a in either one of the above described compositions. Though the flexural strength and the deflection of each CBC substrate 2 improves with increasing thickness, the flexural strength and the deflection of CBC substrate 2 that has ceramic plate 2a made of alumina containing 22.5 wt. % of zirconia and 0.75 wt. % of yttria shows the greatest strength.

The greatly improved flexural strength of CBC substrate 2 exhibits the following effects in power semiconductor device 30 that CBC substrate 2 is mounted on. The major face of metal radiator base 11 of power semiconductor device 30 inevitably warps, and the degree of warpage varies greatly from product to product. As metal radiator base 11 warps, cracks do not develop in the CBC substrate 2, because the CBC substrate 2 exhibits high flexural strength and large deflection tolerance. In addition, thermal conductivity is further improved because the improved flexural strength and deflection tolerance facilitates reducing the thickness of CBC substrate 2. The reduction in thickness allows heat to radiate from power semiconductor device 30 at a faster rate. Better heat radiation capabilities mean that the current-carrying capability of power semiconductor device 30 also increases.

Since the specified compositions of the present invention are based on having, as a main constituent, alumina, the apparatus and method for manufacturing ceramic plate 2a of the invention need not substantially he changed from the conventional methods. And ceramic plate 2a made of alumina can be manufactured at a lower cost than that of a ceramic plate made mainly of aluminum nitride.

Magnesia (MgO), calcia (CaO), and ceria ($CeO_2$) are also added to CBC substrate 2 to improve the properties thereof. Calcia and ceria exhibit almost the same effects as yttria. As will be explained below, the addition of magnesia improves the properties of ceramic plate 2a more than the addition of yttria.

Figure 8A:
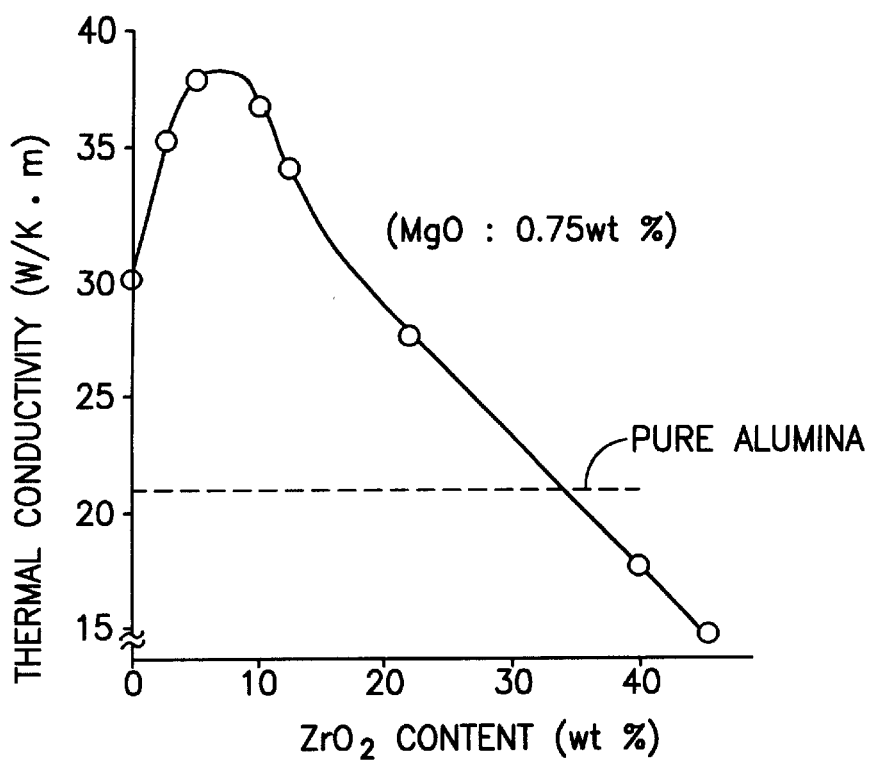
FIG. 8(a) is a graph showing the relation between the thermal conductivity and the added amount of zirconia in an alumina ceramic plate containing 0.75 wt. % of magnesia.
Figure 8B:
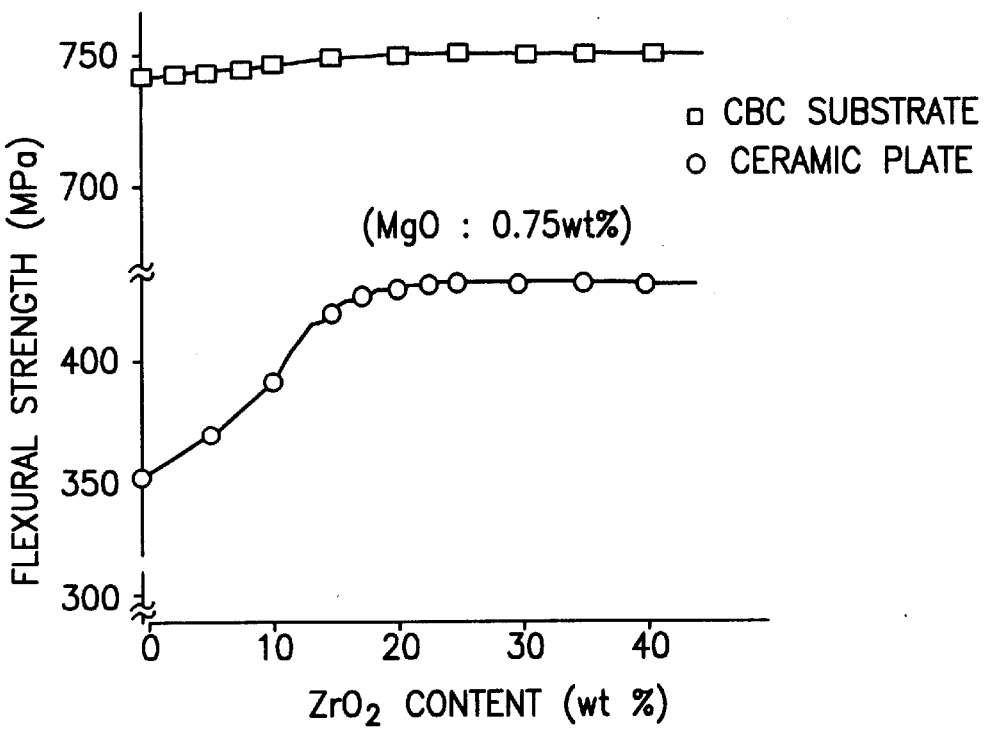
FIG. 8(b) is a graph showing the relation between the flexural strength and the added amount of zirconia in an alumina ceramic plate containing 0.75 wt. % of magnesia and the CBC substrate that has the magnesia doped alumina ceramic plate.
Figure 9A:
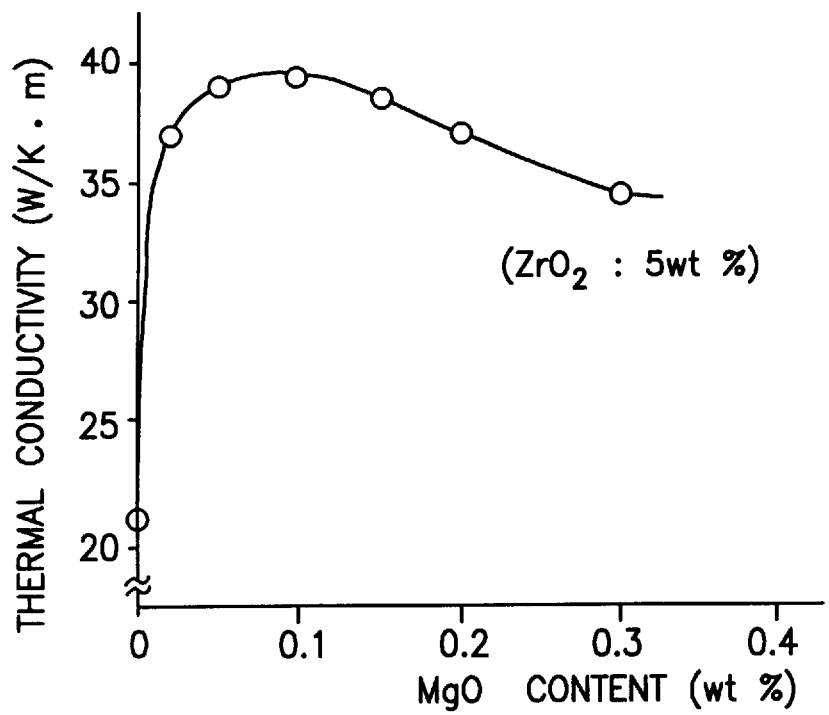
FIG. 9(a) is a graph showing the relation between the thermal conductivity and the added amount of magnesia in an alumina ceramic plate containing 5 wt. % of zirconia.
Figure 9B:
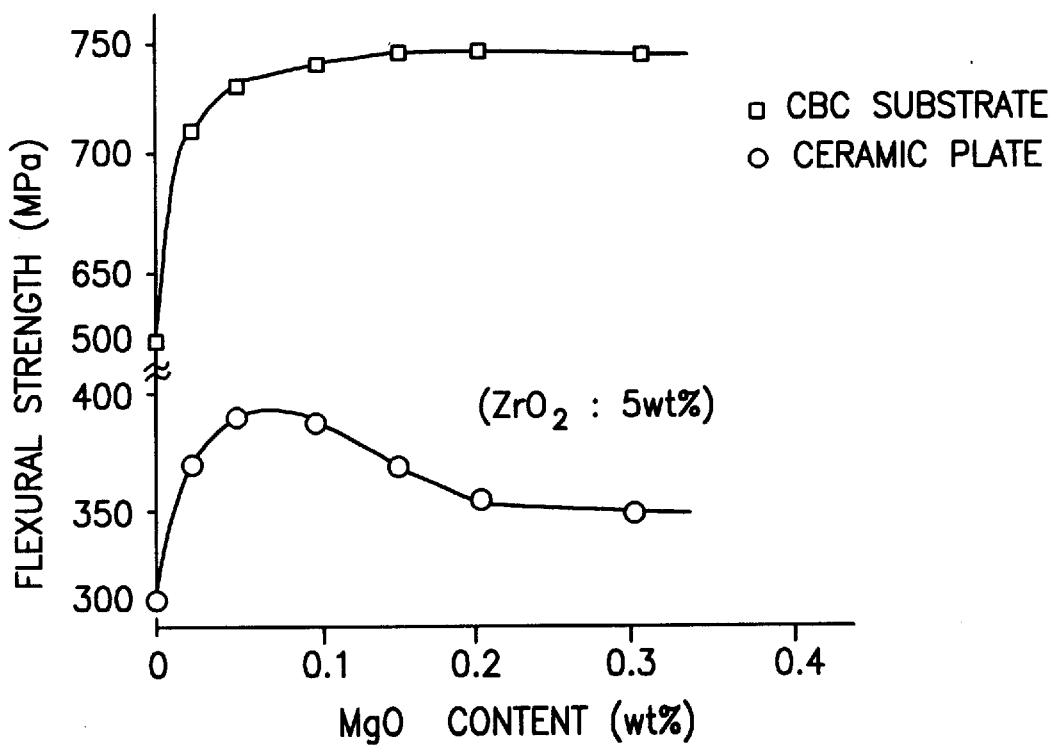
FIG. 9(b) is a graph showing the relation between the flexural strength and the added amount of magnesia in an alumina ceramic plate containing 5 wt. % of zirconia and the CBC substrate that has the magnesia doped alumina ceramic plate.

Referring to FIGS. 3(a), 3(b), and 8(a), the thermal conductivity of ceramic plate 2a doped with magnesia is improved by about 8% more than that of ceramic plate 2a doped with yttria. Referring also to FIG. 8(b), the flexural strength of ceramic plate 2a is also improved by the small added amount of magnesia, and as a result, the flexural strength of CBC substrate 2 is also improved to some extent.

Referring to FIGS. 3(a), 3(b), 9(a), and 9(b), the thermal conductivity and the flexural strength of ceramic plate 2a doped with magnesia and CBC substrate 2 with ceramic plate 2a are almost the same with those shown in FIGS. 5(a) and 5(b) for ceramic plate 2a doped with yttria and CBC substrate 2 with the yttria-doped ceramic plate 2a. However, when the magnesia dose exceeds 0.4 wt. %, large variations result in the shrinkage percentage and mechanical strength of the ceramic plate. Therefore, the optimum amount of magnesia is 0.01 to 0.4 wt. %.

The addition of calcia or ceria to ceramic plate 2a shows effects similar to those caused by the addition of magnesia. The optimum ranges of the additives are 0.02 to 0.5 wt. % for calcia and 0.05 to 2 wt. % for ceria.

The thermal conductivity and the flexural strength were measured for ceramic plate 2a containing at least two kinds of additives selected from the additive group consisting of yttria, magnesia, calcia and ceria. The effects of the double additives are well explained by expressing the total amount of two kinds of additives in mol %.

Figure 10A:
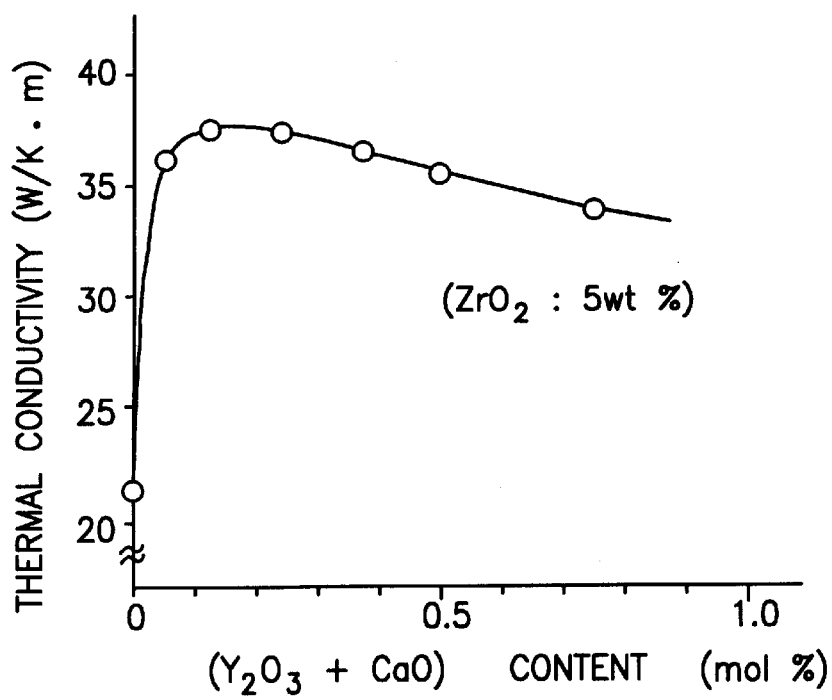
FIG. 10(a) is a graph showing the relation between the thermal conductivity and the added amount of yttria and calcia in an alumina ceramic plate having 5 wt. % of zirconia.
Figure 10B:
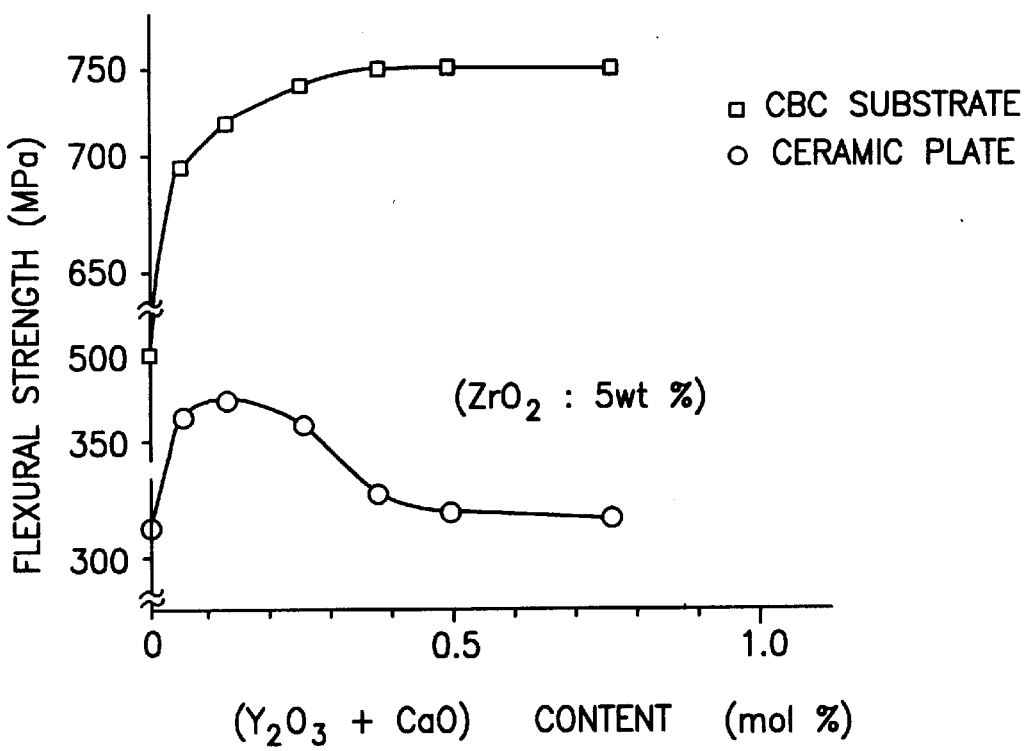
FIG. 10(b) is a graph showing the relation between the flexural strength and the added amount of yttria and calcia in the alumina ceramic plate containing 5 wt. % of zirconia and the CBC substrate that has the yttria and calcia doped ceramic plate.
Figure 11A:
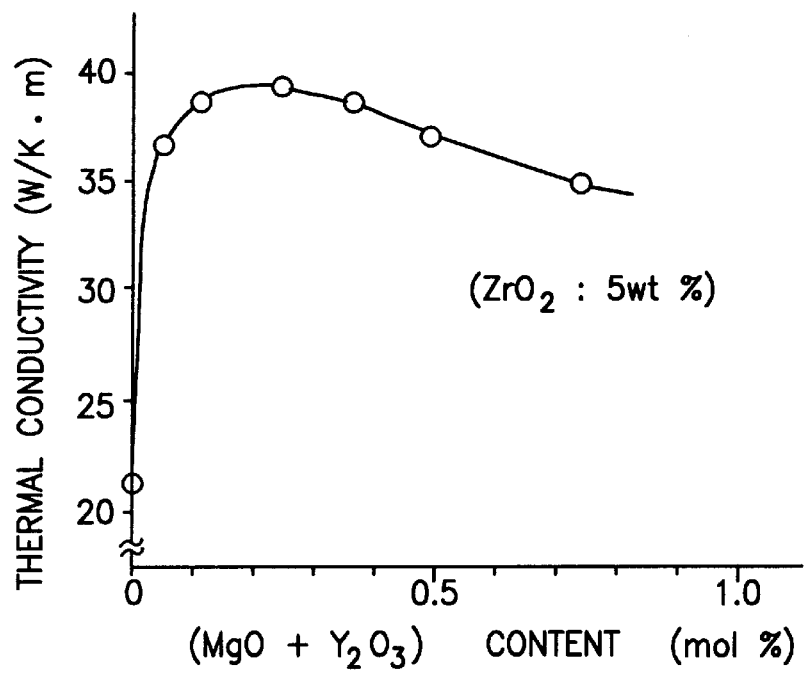
FIG. 11(a) is a graph showing the relation between the thermal conductivity and the added amount of magnesia and yttria in an alumina ceramic plate.
Figure 11B:
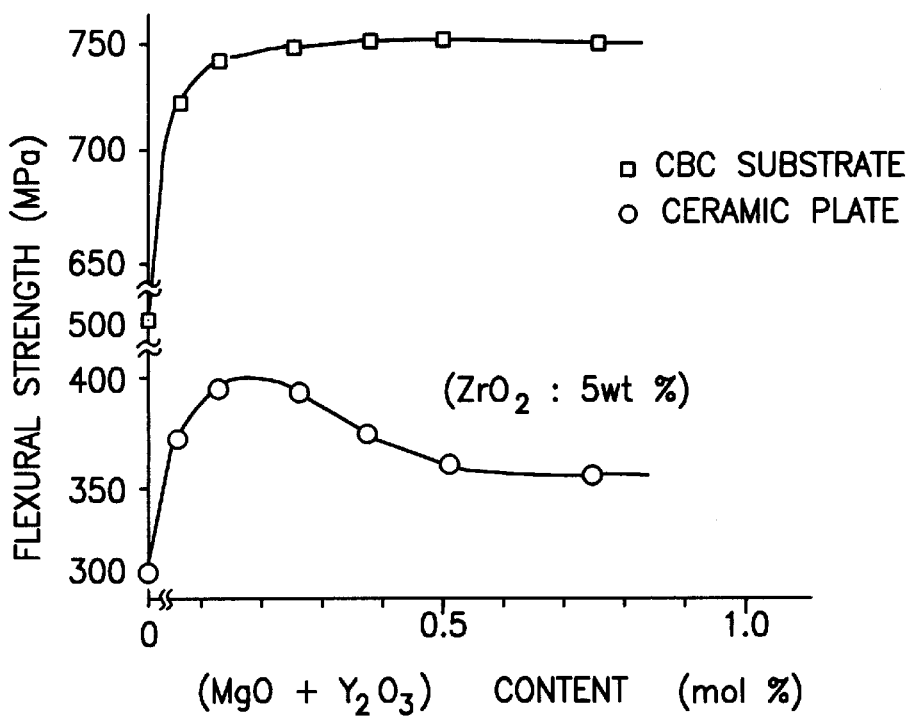
FIG. 11(b) is a graph showing the relation between the flexural strength and the added amount of magnesia and yttria in an alumina ceramic plate and the CBC substrate that has the magnesia and yttria doped alumina ceramic plate.

Referring to FIGS. 10(a) and 10(b), with the added amount of zirconia fixed at 5 wt. %, the thermal conductivity of ceramic plate 2a is a maximum when the total added amount of yttria and calcia is between 0.1 and 0.3 mol %. The flexural strength of ceramic plate 2a is at a maximum when the total added amount of yttria and calcia is between 0.1 and 0.2 mol %.

Properties similar to those of the above described combination of yttria and calcia are obtained by the combination of yttria and ceria, the combination of calcia and ceria, and the combination of yttria, ceria and calcia. However, when the amount of the combined additives exceeds 1 mol %, large variations result in the shrinkage percentage and mechanical strength of the ceramic plate. Therefore, the benefits of the combined additives are realized when the amount of the combined additives is between 0.05 and 1 mol %.

Referring to FIGS. 3(a), 3(b), 11(a), and 11(b), the zirconia content of ceramic plate 2a is fixed at 5 wt. % and a variable amount of magnesia and yttria is added. Ceramic plate 2a and CBC substrate 2 of FIG. 11(b) exhibit a flexural strength that is improved compared to the flexural strength of ceramic plate 2a and CBC substrate 2 with only magnesia added (see FIG. 9(b)). Effects similar to that of ceramic plate 2a containing magnesia and yttria are obtained with ceramic plate 2a containing the combined additives of magnesia and calcia; magnesia and ceria; magnesia, yttria and calcia; magnesia, calcia and ceria; or magnesia, yttria, calcia and ceria. However, when the amount of the additive combinations to ceramic plate 2a exceeds 1 mol %, large variations are caused in the shrinkage percentage and mechanical strength of ceramic plate 2a. Therefore, the benefits of the combined additives are realized when the amount of the combined additives is between 0.05 to 1 mol %.

The same tendencies shown in FIGS. 6 and 7, with ceramic plate 2a containing only the yttria additive, were observed with ceramic plate 2a containing a single additive of magnesia, calcia or ceria, or at least two additives selected from the group consisting of magnesia, calcia, ceria and yttria.

Power semiconductor device 30 of FIGS. 3(a) and 3(b), having a ceramic plate 2a, 0.2 mm in thickness, in CBC substrate 2, and a comparative semiconductor device, including an aluminum nitride ceramic core plate, 0.63 mm in thickness, were subjected to a mechanical deformation tolerance test. Temperature rise caused by a discontinuous current flow was measured on these experimental devices.

In the mechanical deformation tolerance test, metal radiator plate 1 was forced to deform by an external force, and the resultant deterioration in insulative properties of ceramic plate 2a and mechanical strength of ceramic plate 2a were investigated. Ceramic plate 2a is 2.5 times as strong as the aluminum nitride ceramic plate. Ceramic plate 2a of the present invention may be deformed by up to 4 times as much as the aluminum nitride ceramic plate before deterioration of the insulative properties begins to occur. Thus, ceramic plate 2a is improved in strength against insulation deterioration. By adding an appropriate amount of zirconia and an additive or additives (magnesia, calcia, ceria, yttria) to alumina, the thickness of ceramic plate 2a is reducible up to one third the thickness of conventional plates.

The junction temperature rise ($\Delta T$) occurring at the collector of semiconductor chip 3 mounted on CBC substrate 2 that used ceramic plate 2a of the present invention was equivalent or less than the $\Delta T$ occurring at the collector of semiconductor chip 3 mounted on CBC substrate 2 that used the aluminum nitride ceramic plate throughout the mechanical deformation tolerance test. Thus, the current carrying capacity of ceramic plate 2a is several times greater than the conventional alumina plate.

The increased mechanical properties of the core plate of the present invention, as described above, facilitate the use of a thinner plate which results in greater radiation of heat, making it desirable for use as an insulation substrate.

The improvements of power semiconductor device 30 shown in FIGS. 3(a) and 3(b) (ie. the improved strength of the ceramic core plate, the improved adhesion of the ceramic core plate and the copper plates and the resulting elimination of the floated peripheral structure, the increased soldering area of leads on the copper plate, which is made possible by a continuous large area of copper plate, and absorption of the thermal expansion of the gel resin sealant 19 by the space 21) act in collaboration to improve the thermal stress withstand capability as follows. The conventional floated peripheral structure of the copper plate is avoided by virtue of the improved strength of the ceramic core plate of the invention. Therefore, the etching and the cleaning after the etching are not necessary. In addition, the etching residuals which may exude through gaps are not formed.

The bending part for stress relaxation is eliminated from the inner lead, so that it is possible to integrate a plurality of leads into a unitary lead frame. This facilitates assembly of the semiconductor device.

Though the thickness of the ceramic plate is between 0.5 mm and 0.2 mm in the above described embodiment, the benefits of the present invention may still be realized in a ceramic sheet having a thickness between 0.05 to 5 mm, formed by the doctor blade method, the extrusion-rolling method, or calendar method. By adding a binder such as poly(vinylalcohol) to the raw material powder, wet-blending the raw materials, dry-granulating the wet blend by a spray dryer, and forming sheet compacts in a press, ceramic plates having quite uneven sectional profiles may be formed.

By extruding the wet blend, a ceramic sheet having an even cross section in the extrusion direction and uneven cross sections perpendicular to the extrusion direction may be obtained. Using injection molding methods, variously shaped ceramic sheets having uneven cross sections also in the extrusion direction may be obtained. By utilizing the recess portions formed on these uneven ceramic sheets to position upper and lower copper plates 2c and 2b in advance, upper and lower copper plates 2c and 2b and ceramic plates 2a are more readily held together during the bonding of these uneven plates.

In the above described embodiments, the direct bonding method has been described for bonding ceramic plate 2a and upper and lower copper plates 2c and 2b with one another. However, ceramic plate 2a and upper and lower copper plate 2c and 2b may be bonded by any suitable method such as chemically bonding with one another by such bonding methods is the active metal method or the metallizing method, by adding Ti to a silver solder.

Since the junction temperature rise is low on the ceramic core plate of the invention, the substrate is easily designed to conform with warping of the metal radiator plate.

As has been explained so far, a feature of power semiconductor device 30 of the present invention is the composition of ceramic plate 2a of CBC substrate 2. Ceramic plate 2a is obtained by sintering at high temperature the oxide mixture of alumina and an additive or additives selected from a group consisting of zirconia, yttria, calcia, magnesia, and ceria. Ceramic plate 2a exhibits greatly improved mechanical strength compared to the conventional undoped alumina plate or the aluminum nitride plate. The improved mechanical strength results in a substantial reduction in thickness of ceramic plate 2a and more efficient heat radiation from CBC substrate 2 of power semiconductor device 30.

By applying ceramic plate 2a to CBC substrate 2 for a power transistor module, the dimensions and cost of the module are reduced and the current capacity of the module is raised. Since ceramic plate 2a is stronger than the conventional plates, the area of the conventional plate can be widened to provide for higher device integration.

Since part of lead frame 14 need not be bent to provide for stress relaxation of inner lead frame 14, the thickness of power semiconductor device 30 can be reduced. Finally, since the floated periphery is eliminated from the copper plate, manufacturing steps and cost are also reduced.

Having described the preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

what is claimed is:

1. A semiconductor device comprising:
   a lead frame having inner leads;
   a semiconductor chip electrically connected to tips of said inner leads;
   a metal radiator base;
   an insulation substrate fixed on an inner face of said metal radiator base;
   said semiconductor chip mounted on said insulation substrate such that said insulation substrate is between said metal base and said semiconductor chip;
   said insulation substrate including a ceramic plate made from alumina as the main constituent and zirconia added to the alumina;
   said ceramic plate further including at least one additive selected from a group consisting of yttria, calcia, magnesia, and ceria.

2. The semiconductor device of claim 1, wherein said ceramic plate is sintered at 1550° to 1650° C.

3. The semiconductor device of claim 1, wherein said at least one additive is yttria, the content thereof is between 0.1 to 2 weight %.

4. The semiconductor device of claim 1, wherein said at least one additive is calcia, the content thereof is between 0.02 to 0.5 weight %.

5. The semiconductor device of claim 1, wherein said at least one additive is magnesia, the content thereof is between 0.02 to 0.4 weight %.

6. The semiconductor device of claim 1, wherein said at least one additive is ceria, the content thereof is between 0.02 to 0.5 weight %.

7. The semiconductor device of claim 1, wherein said at least one additive includes at least two of said additives, the total content thereof is between 0.05 to 1.0 mol %.

8. The semiconductor device of claim 1, wherein said ceramic insulation plate contains from more than 70 to less than 100 weight % of alumina and more than 0 to less than 30 weight % of zirconia.

9. The semiconductor device of claim 8, wherein said ceramic insulation plate further includes from 0.02 to 2 weight % of said at least one additive selected from a group consisting of yttria, calcia, magnesia, and ceria.

10. The semiconductor device of claim 9, wherein said ceramic plate is sintered at 1550° to 1650° C.

11. The semiconductor device of claim 9, wherein said ceraimic plate is made from powdered raw materials having a grain diameter from 0.5 to 3 $\mu$m.

12. The semiconductor device of claim 1, wherein the content of alumina is between 82 to 97 weight %, and the content of zirconia is from 2.5 to 17.5 weight %.

13. The semiconductor device of claim 1, wherein said ceramic plate is made from powdered raw materials having a grain diameter from 0.5 to 3 $\mu$m.

\* \* \* \* \*